United States Patent
Huang et al.

(10) Patent No.: US 10,856,441 B1
(45) Date of Patent: Dec. 1, 2020

(54) SYSTEM AND METHOD FOR BI-SIDE HEATING VAPOR CHAMBER STRUCTURE IN AN INFORMATION HANDLING SYSTEM

(71) Applicant: DELL PRODUCTS, LP, Round Rock, TX (US)

(72) Inventors: Iris Huang, Taipei (TW); Sean Hu, New Taipei (TW)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 16/682,448

(22) Filed: Nov. 13, 2019

(51) Int. Cl.
*H05K 7/20* (2006.01)
*G06F 1/20* (2006.01)

(52) U.S. Cl.
CPC ........... *H05K 7/20336* (2013.01); *G06F 1/20* (2013.01); *H05K 7/20154* (2013.01)

(58) Field of Classification Search
None
See application file for complete search history.

(56) References Cited

U.S. PATENT DOCUMENTS

| | | | |
|---|---|---|---|
| 8,254,129 B2 * | 8/2012 | Okutsu | G06F 1/203 361/719 |
| 9,668,334 B2 * | 5/2017 | Refai-Ahmed | H05K 7/2039 |
| 9,943,007 B2 * | 4/2018 | Enami | H05K 7/20409 |
| 10,694,638 B1 * | 6/2020 | Lin | F28F 13/00 |
| 2011/0110041 A1 * | 5/2011 | Wong | H05K 7/20445 361/697 |
| 2019/0141855 A1 | 5/2019 | Inagaki et al. | |
| 2019/0269034 A1 | 8/2019 | Stanley | |
| 2019/0274230 A1 * | 9/2019 | North | H05K 7/20154 |
| 2019/0281729 A1 | 9/2019 | Inagaki et al. | |
| 2020/0042053 A1 * | 2/2020 | Cheng | H05K 7/20327 |

\* cited by examiner

*Primary Examiner* — Courtney L Smith
(74) *Attorney, Agent, or Firm* — Larson Newman, LLP (57) ABSTRACT

An information handling system includes a first device including a first heat generating region, a second device including a second heat generating region, and a cooling device. The cooling device has a first hot surface on a first side of the cooling device, a first cold surface on a second side of the cooling device, a second hot surface on the second side of the cooling device, and a second cold surface on the first side of the cooling device. The first heat generating region is thermally attached to the first hot surface. First heat from the first heat generating region is transmitted to the first cold surface. The second heat generating region is thermally attached to the second hot surface. Second heat from the second heat generating region is transmitted to the second cold surface.

20 Claims, 7 Drawing Sheets

SYSTEM AND METHOD FOR BI-SIDE HEATING VAPOR CHAMBER STRUCTURE IN AN INFORMATION HANDLING SYSTEM

FIELD OF THE DISCLOSURE

This disclosure generally relates to information handling systems, and more particularly relates to a bi-side heating vapor chamber structure in an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

An information handling system may include a first device including a first heat generating region, a second device including a second heat generating region, and a cooling device. The cooling device may have a first hot surface on a first side of the cooling device, a first cold surface on a second side of the cooling device, a second hot surface on the second side of the cooling device, and a second cold surface on the first side of the cooling device. The first heat generating region may be thermally attached to the first hot surface. First heat from the first heat generating region may be transmitted to the first cold surface. The second heat generating region may be thermally attached to the second hot surface. Second heat from the second heat generating region may be transmitted to the second cold surface

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
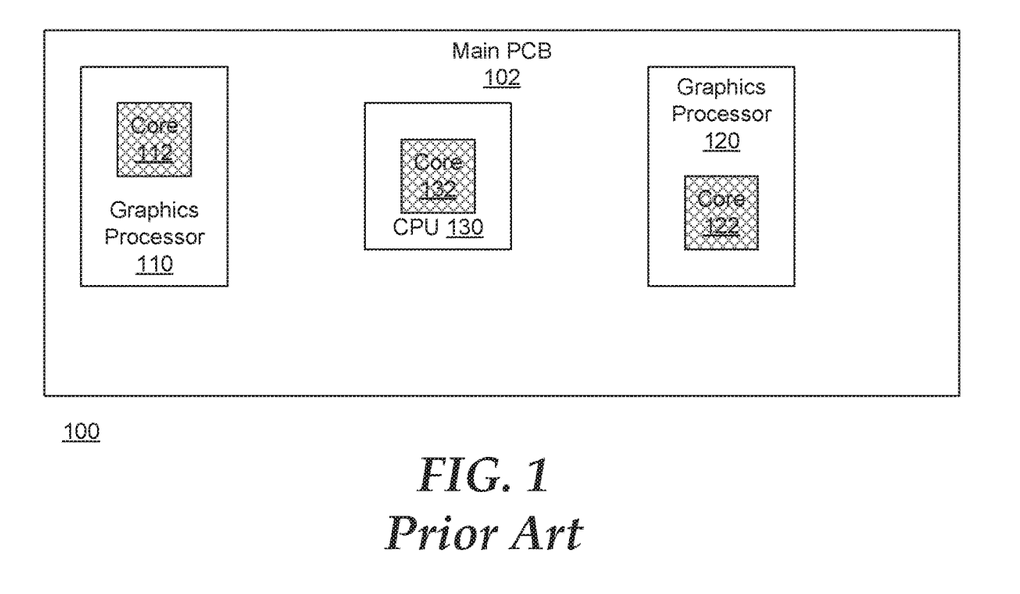
FIGS. 1-4 are block diagrams illustrating an information handling system known in the art.

FIGS. 1-4 illustrate an information handling system 100 in accordance with current practices as are known in the art. In FIG. 1, information handling system 100 includes a main printed circuit board (PCB) 102 to which graphics processors 110 and 120, and a central processing unit (CPU) 130 are attached. Information handling system 100 may be representative of a computer system such as a laptop computer, a notebook computer, or the like. Graphics processors 110 and 120, and CPU 130 will be understood to be attached to PCB 102 by any methods or mechanisms as are known in the art. For example, one or more of graphics processors 110 and 120 and CPU 130 may represent packaged surface mount devices that are soldered to PCB 102, may represent connectorized packaged devices that are installed into mating connectors on the PCB, or may represent other packages as needed or desired. In a typical application, one or more of graphics processors 110 and 120 represent an expansion capability of information handling system 100. For example, information handling system 100 may be populated with no graphics processors in a basic configuration, may be populated with one graphics processor in a performance configuration, and may be populated with both graphics processors in an extreme performance configuration.

Graphics processors 110 and 120 and CPU 130 will be understood to include one or more highly integrated circuit devices that, when in operation, will generate extreme amounts of heat. Such integrated circuit devices are here represented by core regions, where graphics processor 110 includes a core 112, graphics processor 120 includes a core 122, and CPU 130 includes a core 132. It will be understood that graphics processors 110 and 120, and CPU 130 may include one or more additional regions that generate extreme amounts of heat, such as associated voltage regulator circuits, IO circuits, memory circuits, or the like. The teachings of the present invention will be understood to be applicable to one or more heat generating regions on a graphics processor or a CPU as needed or desired.

Figure 2:
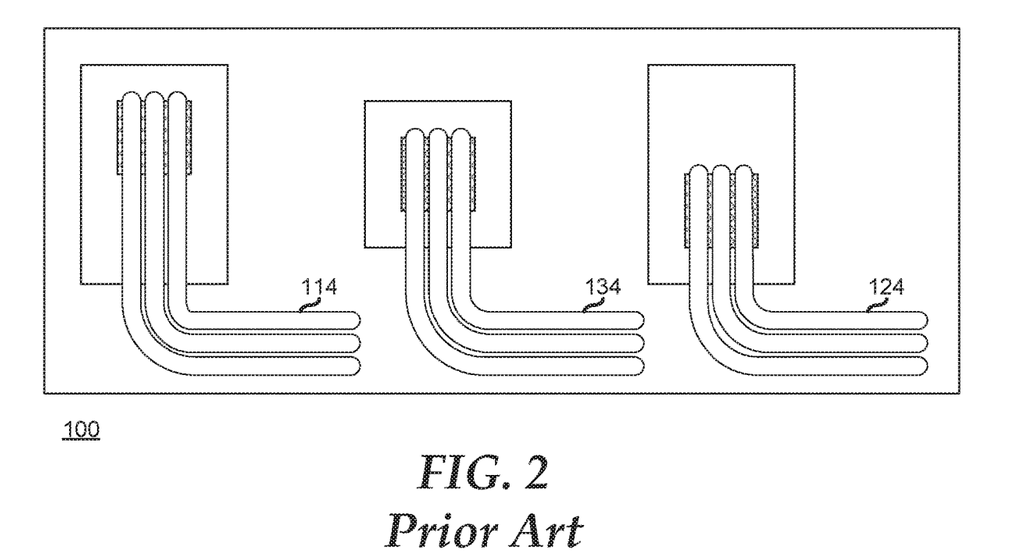

FIG. 2 illustrates information handling system 100 with heat removing apparatuses 114, 124, and 134. Heat removing apparatuses 114, 124, and 134 are representative of various types of heat-exchanging apparatuses for removing heat from respective cores 112, 122, and 132. For example, heat removing apparatuses 114, 124, and 134 may represent one or more of sets of heat pipes, cooling blocks with an integrated fin structure, vapor chambers, or the like that are designed to move the extreme amounts of heat generated at cores 112, 122, and 132 to other areas of information handling system 100. In a typical embodiment, heat removing apparatuses 114, 124, and 134 represent one or more heat pipes that are thermally attached to the surface or respective cores 112, 122, and 132, and are shaped to accommodate thermal, mechanical, and functional design considerations within information handling system 100, as needed or desired.

Figure 3:
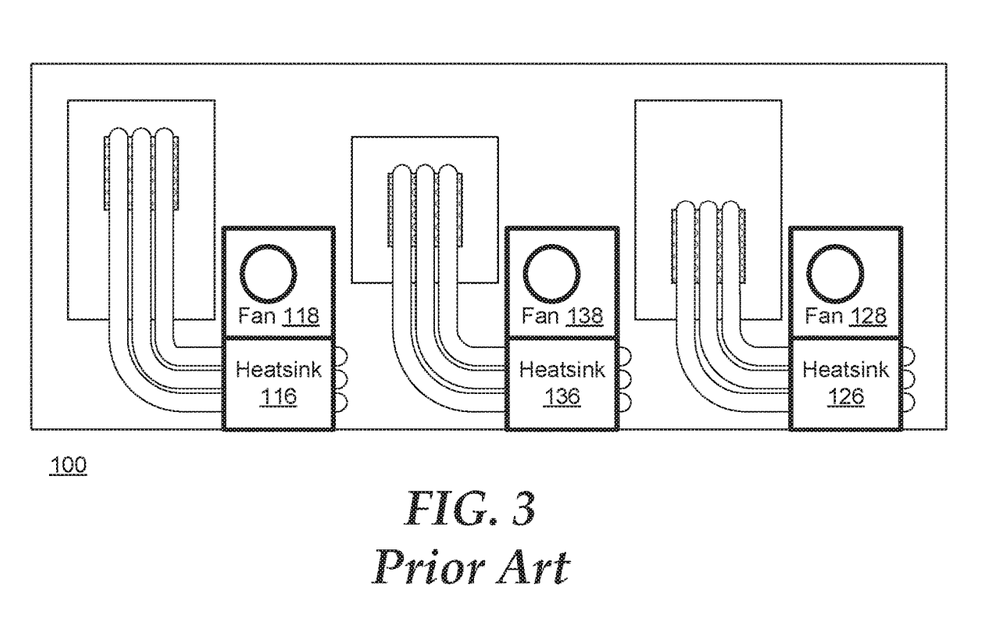

FIG. 3 illustrates information handling system 100 with heat sinks 116, 126, and 136 thermally attached to respective heat removing apparatuses 114, 124, and 134. Heat sinks 116, 126, and 136 operate to move the extreme amounts of heat generated from respective cores 112, 122, and 132 from respective heat removing apparatuses 114, 124, and 134. Heat sinks 116, 126, and 136 are each associated with a respective cooling fan 118, 128, and 138 that operates to blow cooler air across the heat sinks to remove the extreme amounts of heat from information handling system 100. It will be understood that heat removing apparatuses 114, 124, and 134, and associated heat sinks 116, 126, and 136 may be representative of various heat-exchanging apparatuses such as thermal blocks which remove heat via conductive cooling, heat pipes or vapor chambers which remove heat via a combination of conductive cooling and phase-transition cooling, or other heat-exchanging apparatuses, as needed or desired.

Figure 4:
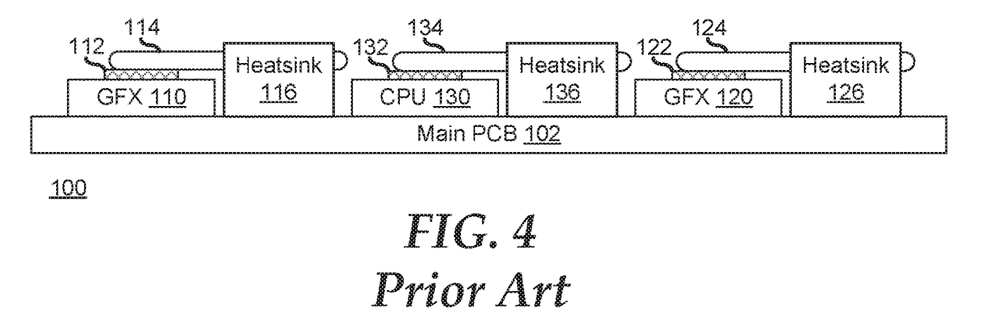

FIG. 4 illustrates a side view of information handling system 100. It will be noted that the stack-up of PCB 102, a processor such as graphics processors 110 or 120 or CPU 130, a core such as cores 112, 122, or 132, an associated heat removing apparatus 114, 124, or 134, and an associated heat sink 116, 126, or 136 will typically be 30-50 mils thick. It will be understood that FIGS. 1-4 may represent an assembly method for information handling system 100, where graphics processors 110 and 120 and CPU 130 are attached to PCB 102, as shown in FIG. 1, heat removing apparatuses 114, 124, and 134 are attached to respective cores 112, 122 and 132, as shown in FIG. 2 and heat sinks 116, 126, and 136 are attached to the respective heat removing apparatuses, as shown in FIG. 3, and where the final assembly is shown in FIG. 4.

Figure 5:
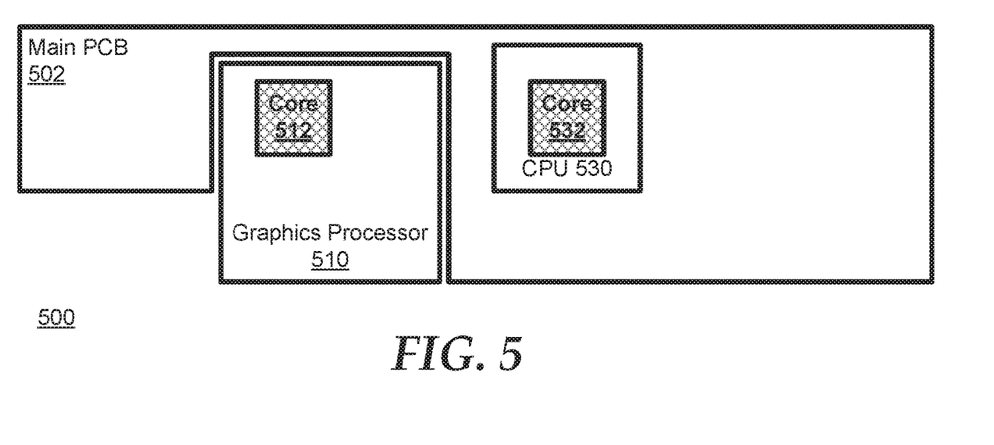
FIGS. 5-11 are block diagrams illustrating an information handling system with a bi-sided vapor chamber according to an embodiment of the present disclosure.

FIGS. 5-11 illustrate an information handling system 500 in accordance with an embodiment of the present disclosure. In FIG. 5, information handling system 500 includes a main printed circuit board (PCB) 502 to which a central processing unit (CPU) 530 is attached. PCB 502 is configured with a cut-out that is roughly the size and shape of a graphics processor, such as an illustrated graphics processor 510, or a graphics processor 520, described below. Graphics processor 510 is electrically connected to PCB 102 on an under side of the PCB, such as via a card edge connector, or another connector situated along one edge of the graphics processor. The mechanisms for electrically and mechanically affixing a graphics processor to a PCB are known in the art, and will not be further described herein, except as may be needed to illustrate the current embodiments. Information handling system 500 is similar to information handling system 100, and may be representative of a computer system such as a laptop computer, a notebook computer, or the like. CPU 530 will be understood to be attached to PCB 502 by any methods or mechanisms as are known in the art. For example, CPU 530 may represent a packaged surface mount device that is soldered to PCB 502, may represent a connectorized packaged device that is installed into a mating connector on the PCB, or may represent another package as needed or desired. In a typical application, one or more of graphics processors 510 and 520 represent an expansion capability of information handling system 500. For example, information handling system 500 may be populated with no graphics processors in a basic configuration, may be populated with one graphics processor in a performance configuration, and may be populated with both graphics processors in an extreme performance configuration.

Graphics processors 510 and 520, described below, and CPU 530 will be understood to include one or more highly integrated circuit devices that, when in operation, will generate extreme amounts of heat. Such integrated circuit devices are here represented by core regions, where graphics processor 510 includes a core 512, graphics processor 520 includes a core 522, and CPU 530 includes a core 532. It will be understood that graphics processors 510 and 520, and CPU 530 may include one or more additional regions that generate extreme amounts of heat, such as associated voltage regulator circuits, IO circuits, memory circuits, or the like. The teachings of the present invention will be understood to be applicable to one or more heat generating regions on a graphics processor or a CPU as needed or desired.

Figure 6:
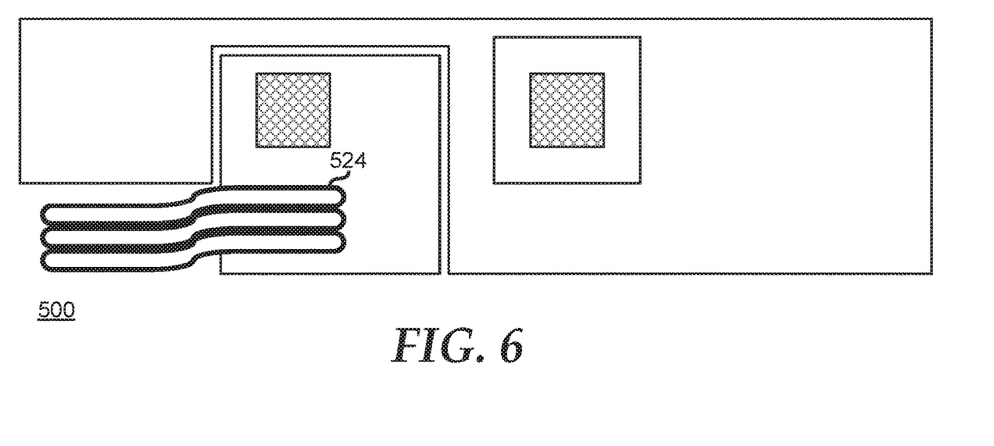

FIG. 6 illustrates information handling system 500 with a heat removing apparatus 524. An additional heat removing apparatus 514, described below, and heat removing apparatus 524 are representative of various types of heat-exchanging apparatuses for removing heat from cores 512, 522, and 532. For example, heat removing apparatuses 514 and 524 may represent one or more of sets of heat pipes, cooling blocks with an integrated fin structure, vapor chambers, or the like that are designed to move the extreme amounts of heat generated at cores 512, 522, and 532 to other areas of information handling system 500. In a typical embodiment, heat removing apparatuses 514 and 524 represent one or more heat pipes that are thermally attached to the surface or respective cores 512, 522, and 532, and are shaped to accommodate thermal, mechanical, and functional design considerations within information handling system 500, as needed or desired.

Figure 7:
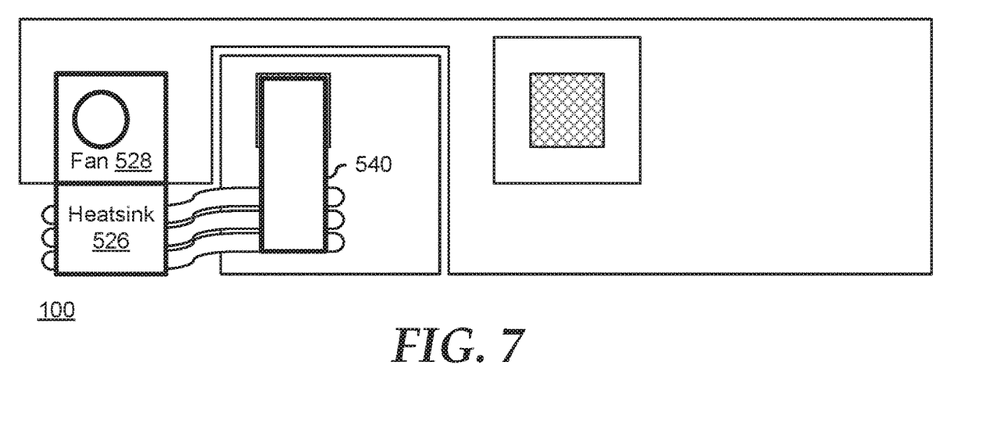
Figure 12:
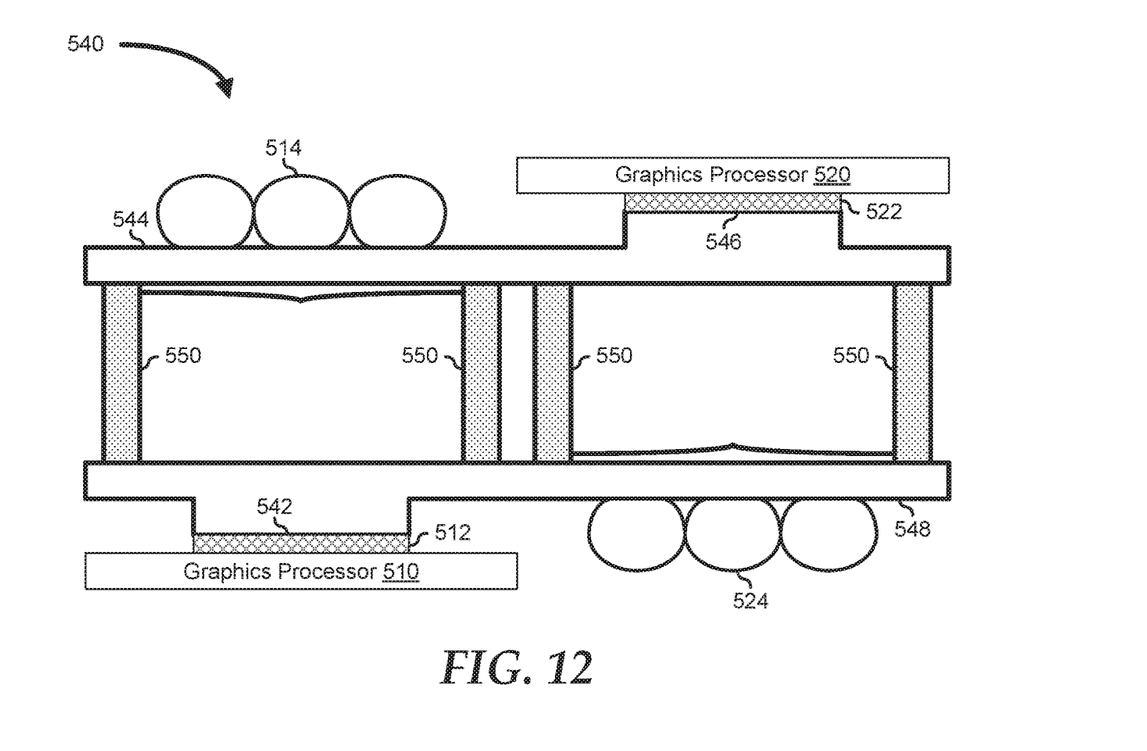
FIG. 12 is a cut-away diagram of the bi-sided vapor chamber of the information handling system of FIGS. 5-11.

FIG. 7 illustrates information handling system 500 with a heat sink 526 thermally attached to heat removing apparatus 524. A heat sink 516, described below, and heat sink 526 operate to move the extreme amounts of heat generated from respective cores 512, 522, and 532 from respective heat removing apparatuses 514 and 524. Heat sinks 516 and 526 are each associated with a respective cooling fan 518, described below, and 528 that operates to blow cooler air across the heat sinks to remove the extreme amounts of heat from information handling system 500. It will be understood that heat removing apparatuses 514 and 524, and associated heat sinks 516 and 526 may be representative of various heat-exchanging apparatuses such as thermal blocks which remove heat via conductive cooling, heat pipes or vapor chambers which remove heat via a combination of conductive cooling and phase-transition cooling, or other heat-exchanging apparatuses, as needed or desired. FIG. 7 also illustrates a bi-side heating vapor chamber 540. Vapor chamber 540 includes a first hot surface and a first cold surface on the underside of the vapor chamber, and a second hot surface and a second cold surface on the topside of the vapor chamber, as shown in FIG. 12 and described below. The first hot surface is thermally attached to core 512, and the first cold surface is thermally attached to heat removing apparatus 524.

Figure 8:
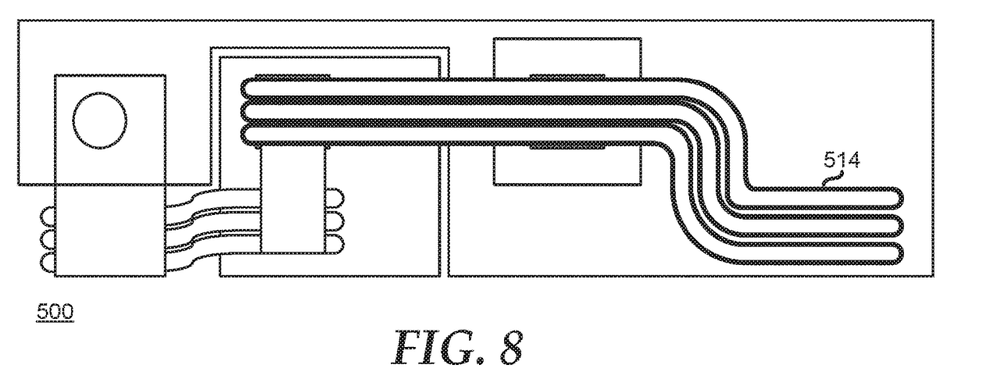

FIG. 8 illustrates information handling system 500 with heat removing apparatus 514 thermally attached to the second cold surface of vapor chamber 540 and to core 530. Heat removing apparatus 514 is configured to move the extreme amounts of heat generated at cores 512 and 532 to other areas of information handling system 500. Note that heat removing apparatus 514 may be configured to have a greater heat-transfer capability than heat removing apparatus 524 in order to effectively move the heat generated by both of cores 512 and 532.

Figure 9:
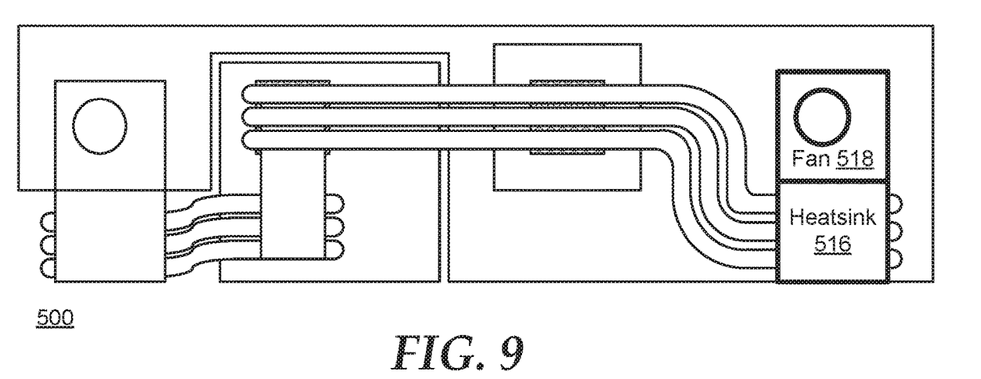

FIG. 9 illustrates information handling system 500 with a heat sink 516 thermally attached to heat removing apparatus 514. Heat sink 516 is associated with a cooling fan 518 that operates to blow cooler air across the heat sink to remove the extreme amounts of heat from information handling system 500. Note that heat sink 516 and fan 518 may be configured to have a greater heat-transfer capability than heat sink 526 and fan 528 in order to effectively move the heat generated by both of cores 512 and 532.

Figure 10:
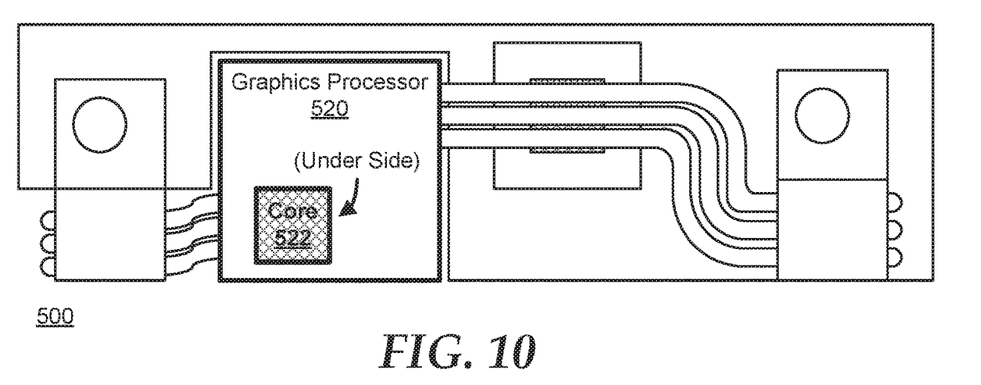

FIG. 10 illustrates information handling system 500 with graphics processor 520 electrically connected to PCB 102 on a top side of the PCB, such as via a card edge connector, or another connector situated along one edge of the graphics processor. Graphics processor 520 includes core 522 which is situated on an under side of the graphics processor, such that the core is thermally attached to the second hot surface of vapor chamber 540.

Information handling system 500 operates to remove the extreme heat generated by graphics processors 510 and 520 and from CPU 530. In particular, heat generated by graphics processor 510 is transferred to the first hot surface of vapor chamber 540, and is conducted to the first cold surface of the vapor chamber via a combination of conductive cooling and phase-transition cooling. The heat generated by graphics processor 510 is transferred from the first cold surface of vapor chamber 540 to heat removing apparatus 514. Similarly, the heat generated by CPU 530 is transferred to heat removing apparatus 514. The heat from both graphics processor 510 and CPU 530 is transferred by heat removing apparatus 514 to heat sink 516, and is removed from information handling system 500 by fan 518. Further, heat generated by graphics processor 520 is transferred to the second hot surface of vapor chamber 540, and is conducted to the second cold surface of the vapor chamber via a combination of conductive cooling and phase-transition cooling. The heat generated by graphics processor 520 is transferred from the second cold surface of vapor chamber 540 to heat removing apparatus 524. The heat from graphics processor 520 is transferred by heat removing apparatus 524 to heat sink 526, and is removed from information handling system 500 by fan 528.

Figure 11:
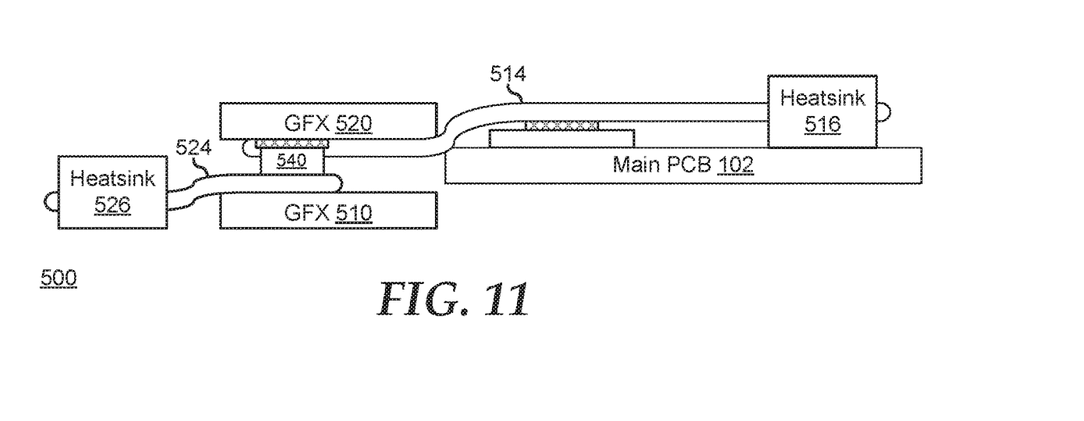

FIG. 11 illustrates a side view of information handling system 500. It will be noted that, because graphics processors 510 and 520 are not mounted atop PCB 502, the stack-up of PCB 502, a processor such as graphics processors 510 or 520 or CPU 530, a core such as cores 512, 522, or 532, an associated heat removing apparatus 514, 524, or 534, an associated heat sink 516, 526, or 536, and an associated vapor chamber 540, will typically be 20-25 mils thick. It will be understood that FIGS. 5-11 may represent an assembly method for information handling system 500, where graphics processor 510 is connected to PCB 502 and CPU 530 is attached to the PCB, as shown in FIG. 5, heat removing apparatus 524 is attached in a location associated with graphics processor 520, as shown in FIG. 6 and heat sink 526 is attached to the heat removing apparatus, as shown in FIG. 7. Further, the first hot surface of vapor chamber 540 is thermally attached to core 512 and the second cold surface of the vapor chamber is thermally attached to heat removing apparatus 524, as shown in FIG. 7. Heat removing apparatus 514 is thermally attached to core 512, as shown in FIG. 8, and heat sink 516 is attached to the heat removing apparatus, as shown in FIG. 9. Finally, graphics processor 520 is connected to PCB 502 and core 522 is thermally attached to the second hot surface of vapor chamber 540, as shown in FIG. 10. Such a final assembly is shown in FIG. 11.

FIG. 12 illustrates a detailed side-cut-away-view of vapor chamber 540. As illustrated, vapor chamber 540 includes first hot surface 542, first cold surface 544, second hot surface 546 and second cold surface 548. Vapor chamber 540 further includes wick structures 550. In operation, first hot surface 542 receives heat from core 512. The heat vaporizes a coolant liquid inside of vapor chamber 540, and the vaporized coolant liquid condenses on first cold surface 544, thereby transferring the heat from graphics processor 510 to heat removing apparatus 514. The condensed liquid flows in wick structures 550 back to first hot surface 542 and the cycle repeats. Similarly, second hot surface 546 receives heat from core 522. The heat vaporizes the coolant liquid inside of vapor chamber 540, and the vaporized coolant liquid condenses on second cold surface 548, thereby transferring the heat from graphics processor 520 to heat removing apparatus 524. The condensed liquid flows in wick structures 550 back to second hot surface 546 and the cycle repeats.

Figure 13:
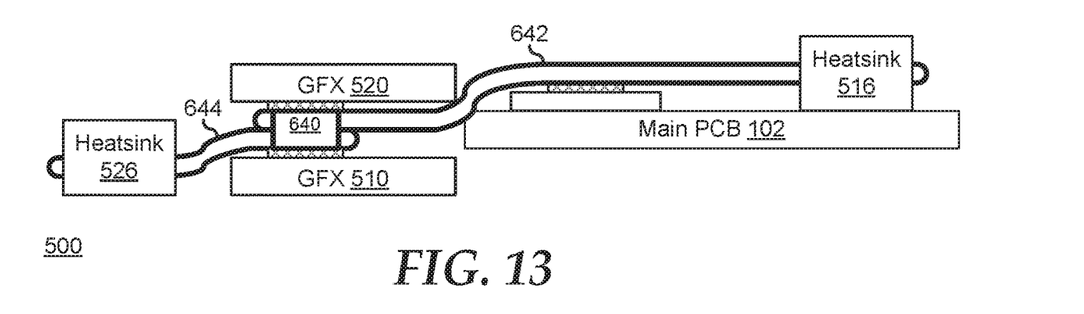
FIG. 13 is a block diagram illustrating the information handling system of FIGS. 5-11 with a bi-sided vapor chamber according to another embodiment of the present disclosure.

FIG. 13 illustrates information handling system 500 as modified with a vapor chamber 640 that integrates a heat removing apparatus 642 similar to heat removing apparatus 514, and a heat removing apparatus 644 similar to heat removing apparatus 524. An example of an integrated vapor chamber/heat removing apparatus may include a vapor chamber that integrates one or more heat pipes associated with each side of a bi-sided vapor chamber, such that a first side of the bi-sided vapor chamber is thermally integrated with heat pipes for removing heat from one or more first processors, and that a second side of the bi-sided vapor chamber is thermally integrated with heat pipes for removing heat from one or more second processors.

Figure 14:
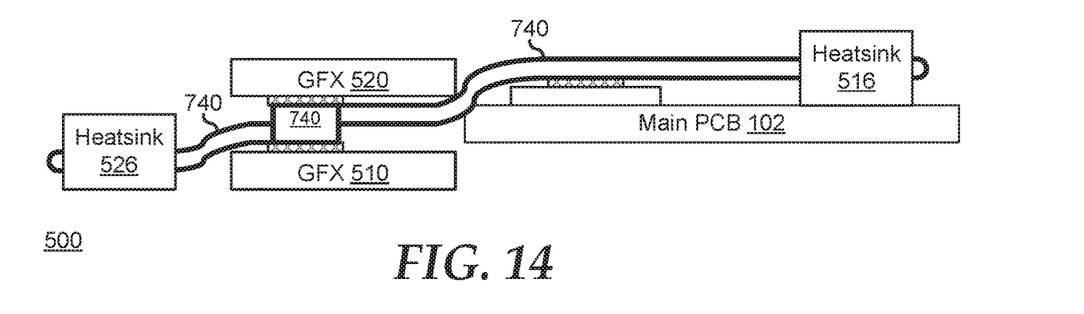
FIG. 14 is a block diagram illustrating the information handling system of FIGS. 5-11 with a bi-sided vapor chamber according to another embodiment of the present disclosure.

FIG. 14 illustrates information handling system 500 as modified with a vapor chamber 740. Here vapor chamber 740 includes heat removing apparatuses that are themselves integrated parts of the vapor chamber, permitting continuous vapor transfer from the cores to the associated heat sinks.

Figure 15:
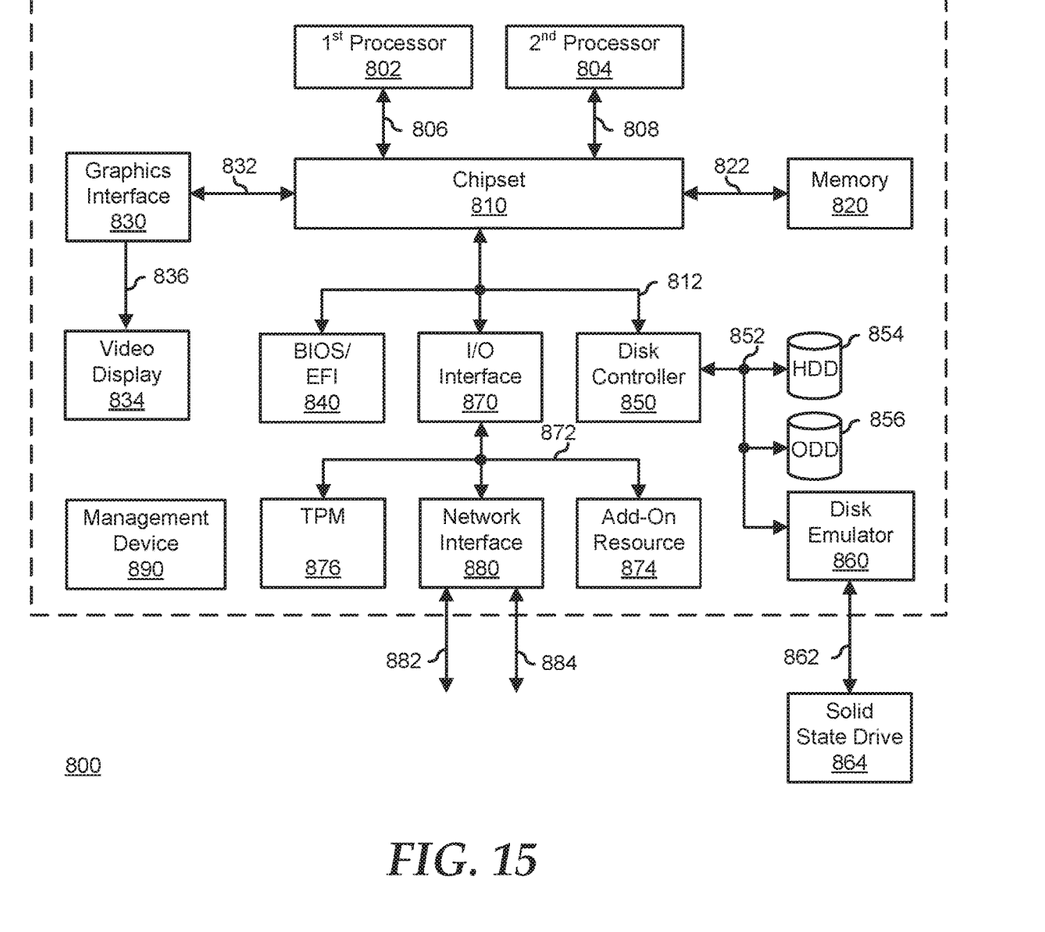
FIG. 15 is a block diagram illustrating an information handling system according to another embodiment of the present disclosure.

FIG. 15 illustrates a generalized embodiment of an information handling system 800 similar to information handling systems 100 and 500. For purpose of this disclosure information handling system 800 can be configured to provide the features and to perform the functions of the OPF system as described herein. Information handling system 800 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 800 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 800 can include processing resources for executing machine-executable code, such as a central processing unit (CPU), a programmable logic array (PLA), an embedded device such as a System-on-a-Chip (SoC), or other control logic hardware. Information handling system 800 can also include one or more computer-readable medium for storing machine-executable code, such as software or data. Additional components of information handling system 800 can include one or more storage devices that can store machine-executable code, one or more communications ports for communicating with external devices, and various input and output (IO) devices, such as a keyboard, a mouse, and a video display. Information handling system 800 can also include one or more buses operable to transmit information between the various hardware components.

Information handling system 800 can include devices or modules that embody one or more of the devices or modules described below, and operates to perform one or more of the methods described below. Information handling system 800 includes a processors 802 and 804, a chipset 810, a memory 820, a graphics interface 830, a basic input and output system/universal extensible firmware interface (BIOS/UEFI) module 840, a disk controller 850, a hard disk drive (HDD) 854, an optical disk drive (ODD) 856, a disk emulator 860 connected to an external solid state drive (SSD) 862, an input/output (I/O) interface 870, one or more add-on resources 874, a trusted platform module (TPM) 876, a network interface 880, a management device 890, and a power supply 895. Processors 802 and 804, chipset 810, memory 820, graphics interface 830, BIOS/UEFI module 840, disk controller 850, HDD 854, ODD 856, disk emulator 860, SSD 862, I/O interface 870, add-on resources 874, TPM 876, and network interface 880 operate together to provide a host environment of information handling system 800 that operates to provide the data processing functionality of the information handling system. The host environment operates to execute machine-executable code, including platform BIOS/UEFI code, device firmware, operating system code, applications, programs, and the like, to perform the data processing tasks associated with information handling system 800.

In the host environment, processor 802 is connected to chipset 810 via processor interface 806, and processor 804 is connected to the chipset via processor interface 808. Memory 820 is connected to chipset 810 via a memory bus 822. Graphics interface 830 is connected to chipset 810 via a graphics interface 832, and provides a video display output 836 to a video display 834. In a particular embodiment, information handling system 800 includes separate memories that are dedicated to each of processors 802 and 804 via separate memory interfaces. An example of memory 820 includes random access memory (RAM) such as static RAM (SRAM), dynamic RAM (DRAM), non-volatile RAM (NVRAM), or the like, read only memory (ROM), another type of memory, or a combination thereof.

BIOS/UEFI module 840, disk controller 850, and I/O interface 870 are connected to chipset 810 via an I/O channel 812. An example of I/O channel 812 includes a Peripheral Component Interconnect (PCI) interface, a PCI-Extended (PCI-X) interface, a high speed PCI-Express (PCIe) interface, another industry standard or proprietary communication interface, or a combination thereof. Chipset 810 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof BIOS/UEFI module 840 includes BIOS/UEFI code operable to detect resources within information handling system 800, to provide drivers for the resources, initialize the resources, and access the resources. BIOS/UEFI module 840 includes code that operates to detect resources within information handling system 800, to provide drivers for the resources, to initialize the resources, and to access the resources.

Disk controller 850 includes a disk interface 852 that connects the disk controller to HDD 854, to ODD 856, and to disk emulator 860. An example of disk interface 852 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 860 permits SSD 864 to be connected to information handling system 800 via an external interface 862. An example of external interface 862 includes a USB interface, an IEEE 1394 (Firewire) interface, a proprietary interface, or a combination thereof. Alternatively, solid-state drive 864 can be disposed within information handling system 800.

I/O interface 870 includes a peripheral interface 872 that connects the I/O interface to add-on resource 874, to TPM 876, and to network interface 880. Peripheral interface 872 can be the same type of interface as I/O channel 812, or can be a different type of interface. As such, I/O interface 870 extends the capacity of I/O channel 812 when peripheral interface 872 and the I/O channel are of the same type, and the I/O interface translates information from a format suitable to the I/O channel to a format suitable to the peripheral channel 872 when they are of a different type. Add-on resource 874 can include a data storage system, an additional graphics interface, a network interface card (NIC), a sound/video processing card, another add-on resource, or a combination thereof. Add-on resource 874 can be on a main circuit board, on separate circuit board or add-in card disposed within information handling system 800, a device that is external to the information handling system, or a combination thereof.

Network interface 880 represents a NIC disposed within information handling system 800, on a main circuit board of the information handling system, integrated onto another component such as chipset 810, in another suitable location, or a combination thereof. Network interface device 880 includes network channels 882 and 884 that provide interfaces to devices that are external to information handling system 800. In a particular embodiment, network channels 882 and 884 are of a different type than peripheral channel 872 and network interface 880 translates information from a format suitable to the peripheral channel to a format suitable to external devices. An example of network channels 882 and 884 includes InfiniBand channels, Fibre Channel channels, Gigabit Ethernet channels, proprietary channel architectures, or a combination thereof. Network channels 882 and 884 can be connected to external network resources (not illustrated). The network resource can include another information handling system, a data storage system, another network, a grid management system, another suitable resource, or a combination thereof.

Management device 890 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 800. In particular, management device 890 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 800, such as system cooling fans and power supplies. Management device 890 can include a network connection to an external management system, and the management device can communicate with the management system to report status information for information handling system 800, to receive BIOS/UEFI or system firmware updates, or to perform other task for managing and controlling the operation of information handling system 800. Management device 890 can operate off of a separate power plane from the components of the host environment so that the management device receives power to manage information handling system 800 when the information handling system is otherwise shut down. An example of management device 890 may include a commercially available BMC product that operates in accordance with an Intelligent Platform Management Initiative (IPMI) specification, such as a Integrated Dell Remote Access Controller (iDRAC), or the like. Management device 890 may further include associated memory devices, logic devices, security devices, or the like, as needed or desired.

Power supply 895 represents one or more devices for power distribution to the components of information handling system 800. In particular, power supply 895 can include a main power supply that receives power from an input power source, such as a wall power outlet, a power strip, a battery, or another power source, as needed or desired. Here, power source 895 operates to convert the power at a first voltage level from the input power source to one or more power rails that are utilized by the components of information handling system. Power supply 895 can also include one or more voltage regulators (VRs) that each receive power from the main power supply and that operate to convert the input voltage to an output voltage that is used by one or more components of information handling system. For example, a VR can be provided for each of processors 802 and 804, and another VR can be provided for memory 820. Power supply 895 can be configured to provide a first power plane that provides power to the host environment, and to provide a second power plane that provides power to the management environment.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system, comprising:
   a first device including a first heat generating region;
   a second device including a second heat generating region; and
   a cooling device having a first hot surface on a first side of the cooling device, a first cold surface on a second side of the cooling device, a second hot surface on the second side of the cooling device, and a second cold surface on the first side of the cooling device;
   wherein the first heat generating region is thermally attached to the first hot surface and first heat from the first heat generating region is transmitted to the first cold surface, and wherein the second heat generating region is thermally attached to the second hot surface and second heat from the second heat generating region is transmitted to the second cold surface.

2. The information handling system of claim 1, wherein the cooling device is a vapor chamber.

3. The information handling system of claim 2, wherein the vapor chamber evaporates a cooling liquid at the first hot surface to remove the first heat from the first device, and evaporates the cooling liquid at the second hot surface to remove the second heat from the second device.

4. The information handling system of claim 3, wherein the vapor chamber condenses the cooling liquid at the first cold surface to transfer the first heat to the first cold surface, and condenses the cooling liquid at the second cold surface to transfer the second heat to the second cold surface.

5. The information handling system of claim 4, wherein the vapor chamber includes a first wick structure to transfer the condensed cooling liquid from the first cold surface to the first hot surface, and includes a second wick structure to transfer the condensed cooling liquid from the second cold surface to the second hot surface.

6. The information handling system of claim 1, further comprising:
   a first heat removing apparatus thermally attached to the first cold surface to remove the first heat from the first cold surface; and
   a second heat removing apparatus thermally attached to the second cold surface to remove the second heat from the second cold surface.

7. The information handling system of claim 6, further comprising:
   a first heat sink thermally attached to the first heat removing apparatus to remove the first heat from the first heat removing apparatus; and
   a second heat sink thermally attached to the second heat removing apparatus to remove the second heat from the second heat removing apparatus.

8. The information handling system of claim 7, further comprising:
   a first fan thermally configured to blow air over the first heat sink to remove the first heat from the information handling system; and
   a second fan thermally configured to blow air over the second heat sink to remove the second heat from the information handling system.

9. The information handling system of claim 6, wherein the first and second heat removing apparatuses are heat pipes.

10. The information handling system of claim 6, wherein the first and second heat removing apparatuses are integrated with the vapor chamber.

11. A method, comprising:
thermally attaching a first heat generating region of a first device of an information handling system to a first hot surface on a first side of a cooling device;
transmitting first heat from the first heat generating region to a first cold surface on a second side of the cooling device;
thermally attaching a second heat generating region of a second device of the information handling system to a second hot surface on the second side of the cooling device; and
transmitting second heat from the second heat generating region to a second cold surface on the first side of the cooling device.

12. The method of claim 11, wherein the cooling device is a vapor chamber.

13. The method of claim 12, further comprising:
evaporating, in the vapor chamber, a cooling liquid at the first hot surface to remove the first heat from the first device; and
evaporating, in the vapor chamber, the cooling liquid at the second hot surface to remove the second heat from the second device.

14. The method of claim 13, further comprising:
condensing, in the vapor chamber, the cooling liquid at the first cold surface to transfer the first heat to the first cold surface; and
condensing, in the vapor chamber, the cooling liquid at the second cold surface to transfer the second heat to the second cold surface.

15. The method of claim 14, further comprising:
transferring, by a first wick structure of the vapor chamber, the condensed cooling liquid from the first cold surface to the first hot surface; and
transferring, by a second wick structure of the vapor chamber, the condensed cooling liquid from the second cold surface to the second hot surface.

16. The method of claim 11, further comprising:
removing, by a first heat removing apparatus thermally attached to the first cold surface, the first heat from the first cold surface; and
removing, by a second heat removing apparatus thermally attached to the second cold surface, the second heat from the second cold surface.

17. The method of claim 16, further comprising:
removing, by a first heat sink thermally attached to the first heat removing apparatus, the first heat from the first heat removing apparatus; and
removing, by a second heat sink thermally attached to the second heat removing apparatus, the second heat from the second heat removing apparatus.

18. The method of claim 17, further comprising:
blowing, by a first fan, air over the first heat sink to remove the first heat from the information handling system; and
blowing, by a second fan, air over the second heat sink to remove the second heat from the information handling system.

19. The method of claim 16, wherein the first and second heat removing apparatuses are heat pipes.

20. A vapor chamber to remove first heat from a first device and to remove second heat from a second device, the vapor chamber comprising:
a first hot surface on a first side of the vapor chamber to receive the first heat from the first device;
a first cold surface on a second side of the vapor chamber to receive the first heat from the first hot surface;
a second hot surface on the second side of the vapor chamber to receive the second heat from the second device; and
a second cold surface on the first side of the vapor chamber to receive the second heat from the second hot surface.

* * * * *